(12) United States Patent
Feldtkeller

(10) Patent No.: US 7,982,452 B2
(45) Date of Patent: Jul. 19, 2011

(54) DETECTION OF A LOAD STATE OF A HALF-BRIDGE

(75) Inventor: Martin Feldtkeller, Munich (DE)

(73) Assignee: Infineon Technologies Austria AG, Villach (AT)

( * ) Notice: Subject to any disclaimer, the term of this patent is extended or adjusted under 35 U.S.C. 154(b) by 168 days.

(21) Appl. No.: 12/512,058

(22) Filed: Jul. 30, 2009

(65) Prior Publication Data

US 2011/0025301 A1 Feb. 3, 2011

(51) Int. Cl.
*G01R 19/18* (2006.01)
(52) U.S. Cl. .................................................. 324/120
(58) Field of Classification Search ............. 324/120
See application file for complete search history.

(56) References Cited

U.S. PATENT DOCUMENTS

| | | | | |
|---|---|---|---|---|
| 4,910,416 A | * | 3/1990 | Salcone | ..................... 327/374 |
| 5,973,943 A | | 10/1999 | Ribarich et al. | |
| 6,486,714 B2 | * | 11/2002 | Ushida et al. | ................. 327/108 |
| 2008/0278225 A1 | | 11/2008 | Hu et al. | |

FOREIGN PATENT DOCUMENTS

| | | |
|---|---|---|
| EP | 0 852 453 | 7/1998 |
| EP | 1333707 | 8/2003 |
| WO | 98/11763 | 3/1998 |

* cited by examiner

*Primary Examiner* — Ha Tran T Nguyen
*Assistant Examiner* — Tung X Nguyen
(74) *Attorney, Agent, or Firm* — Dicke, Billig & Czaja, PLLC

(57) ABSTRACT

Disclosed is a method for diagnosing a half-bridge having a first and a second switching element. The method includes providing a half-bridge that has a first and a second switching element connected in series with each other. The first and the second switching element are driven on and off cyclically, with the switching elements during one drive cycle being alternatingly driven on and off such that they are alternatingly subject to a load current flowing therethrough. A current measuring signal is provided, representing a current flow through one of the switching elements. A first reference signal is provided. A first diagnostic signal is generated that is dependent on an integral of the measuring signal over a first integration period, and on an integral of a first reference signal over a second integration period.

20 Claims, 7 Drawing Sheets

DETECTION OF A LOAD STATE OF A HALF-BRIDGE

TECHNICAL FIELD

The present disclosure relates to a circuit arrangement and a method for detection of a load state of a half-bridge.

BACKGROUND

A half-bridge includes two switching elements each having a drive terminal and load path, the load paths of which are connected in series with each other between supply potential terminals during operation, with a supply voltage being applied between the supply potential terminals. An output to which a load can be connected to is arranged between the load paths. By alternatingly switching the two switches on and off form a voltage present between the positive and the negative supply potentials an alternating voltage can be produced that is available at the output of the half-bridge. Driving the two switching elements is performed by two drive signals, one of each being applied to the drive terminal of one of the switching elements. These drive signals can assume an on-level for switching on the individual switching element, and an off-level for switching off the individual switching element.

For monitoring a current flowing through the half-bridge a measuring resistor (shunt resistor) that is connected in series with the load path of one of the switching elements can be used. A measurement voltage that is present across this resistor is a measure of the current flowing through the half-bridge during one half-cycle of the alternating current.

In applications, such as, e.g., lamp ballasts or LLC converters, in which the current flowing through the half-bridge has no direct component the measurement voltage can be used for determining a mean power consumption, because at a constant input voltage the arithmetical mean of this voltage is a measure of the mean power consumption. Calculation of the mean is, e.g., performed using an RC filter.

Half-bridges are, e.g., applied in lamp ballasts. In this case a load connected to the half-bridge includes a series oscillator circuit and a fluorescent lamp (gas discharge lamp). For such kind of load an output current of the half-bridge is an alternating current. Usually switching frequencies, with which the switching elements of a half-bridge in such a lamp ballast are driven, are in the range of several 10 kHz, such as, for example, 50 kHz; the frequency of the output current and the frequency of the measurement signal, respectively, correspond to the drive frequency in this case.

For an average determination of a measuring signal having a frequency of several 10 kHz an RC filter is necessary having a time constant of about 1 ms. However, for implementing such an RC filter capacitances are required that are too large for implementing them as integrated components in an integrated circuit.

For these and other reasons there is a need for the present invention.

BRIEF DESCRIPTION OF THE DRAWINGS

In the following, examples will be explained with reference to drawings. These drawings serve to explain the basic principle, so that only features necessary for understanding the basic principle are illustrated in the drawings. In the drawings like reference characters denote like features, unless indicated otherwise.

DETAILED DESCRIPTION OF THE DRAWINGS

Figure 1:
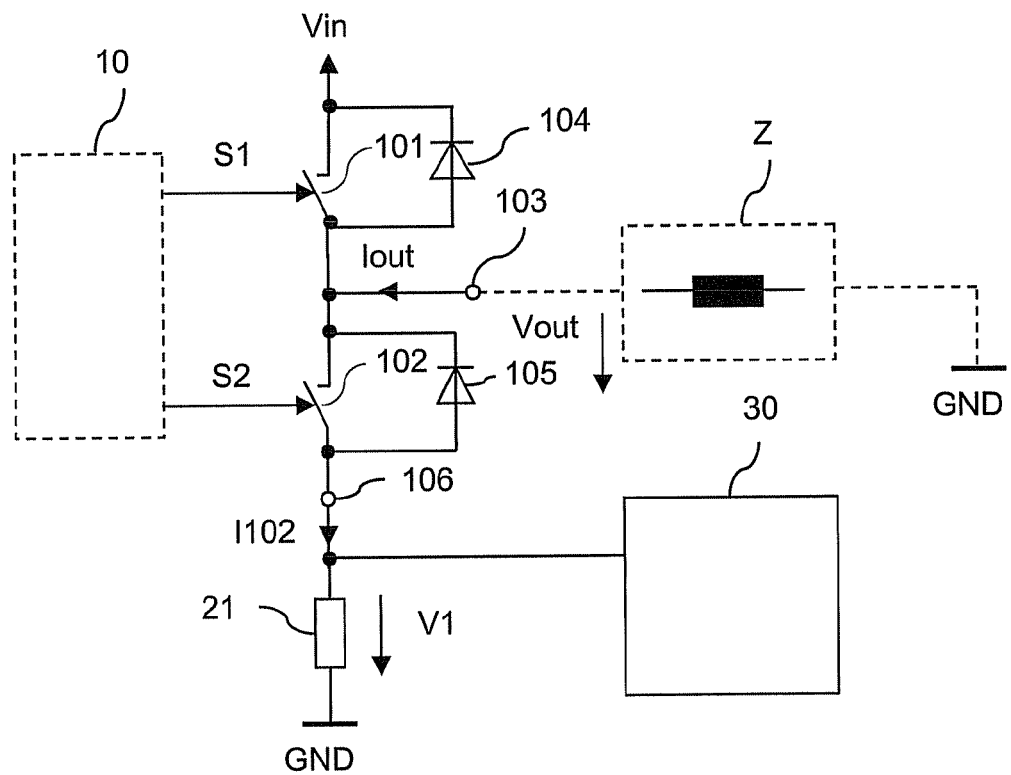
FIG. 1 illustrates one embodiment of a circuit arrangement having a half-bridge with two switching elements, a diagnostic circuit connected to the half-bridge, and a load connected to the half-bridge.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

One embodiment of the present disclosure relates to a method for diagnosing a half-bridge having a first and a second switching element connected in series with each other and being driven on an off cyclically, with the switching elements during one drive cycle being alternatingly driven on and off such that they are alternatingly subject to a load current flowing through. The method includes: providing a current measuring signal representing a current flow through one of the switching elements; providing a first reference signal; providing a first diagnostic signal that is dependent on an integral of the measuring signal over a first integration period, and on an integral of a first reference signal over a second integration period.

Another embodiment relates to a circuit arrangement for diagnosing a half-bridge having a first and a second switching element that are connected in series with each other and that may cyclically be driven on and off, and that during one drive cycle may alternatingly be driven on and off such that they are alternatingly subject to a load current flowing through. The circuit arrangement includes: an input for applying a current measuring signal representing a current flow through one of the switching elements; a reference voltage source for providing a first reference signal; a first diagnostic circuit being adapted to generate a first diagnostic signal that is dependent on an integral of the measuring signal over a first integration period, and on an integral of a first reference signal over a second integration period.

Another embodiment relates to a method for diagnosing a half-bridge having a first and a second switching element being connected in series with each other and being cyclically driven on and off, the switching elements during one drive cycle being alternatingly driven on and off such that they are alternatingly subject to a load current flowing through. The method involves: providing a first current measuring signal using a measuring resistor connected in series with the second switching element; evaluating the current measuring signal using a first and a second reference signal, the first reference signal being generated by a first reference signal source. Providing the second reference signal includes: driving a reference current through the current measuring resistor during a time period in which a load current through the second switching element is zero; generating the second reference signal dependent on a voltage drop across the measuring resistor affected by the reference current.

FIG. 1, by way of an equivalent circuit diagram, illustrates a circuit arrangement having a half-bridge with two switching elements: a first switching element 101, and a second switching element 102, each having a load path and a drive input. The load paths of the two switching elements 101, 102 are connected in series with each other between terminals for a first supply potential Vin and a second supply potential GND. The first supply potential Vin is, e.g., a positive supply potential, the second supply potential is, e.g., a negative supply potential, or a reference potential, such as ground. The half-bridge further includes an output 103 that is arranged between the load paths 101, 102 of the switching elements, and that is formed by a node common to the load paths 101, 102 in the example illustrated. In this connection it should be mentioned that further circuit components, such as a measuring resistor (not illustrated), may be arranged between the load paths of the two switching elements 101, 102.

The first switching element 101, that is connected between the terminal for the first supply potential Vin and the output 103, will also be referred to as upper switching element or high-side switch of the half-bridge in the following, and the second switching element 102, that is connected between the output 103 and the second supply potential GND, will also be referred to as lower switching element or low-side switch of the half-bridge in the following. The switching elements 101, 102 are driven to be conducting or driven to be blocking—or are switched on or off, respectively—dependent on drive signals S1, S2 that are applied to their drive inputs. In FIG. 1 reference character S1 denotes a first drive signal applied to the drive input of the first switching element 101, and reference character S2 denotes a second drive signal applied to the drive input of the second switching element 102.

Figures 2A, 2B:
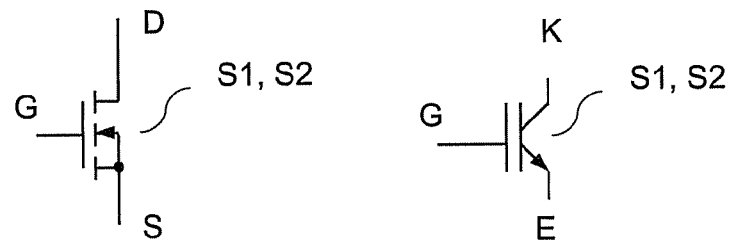
FIGS. 2A, 2B illustrate an implementation example of the switching elements.

The switching elements 101, 102 may be any switching elements that can be switched on and off by electric drive signals, such as drive signals S1, S2. Such switching elements are in one embodiment semiconductor switching elements. Examples of semiconductor switching elements 101, 102 that are suitable for use in the half-bridge are, referring to FIG. 2A, MOSFET, in one embodiment power MOSFETs, or, referring to FIG. 2B, IGBTs in one embodiment power IGBTs. MOSFETs and IGBTs, respectively, include a drain-source path G-S (in a MOSFET) and a collector-emitter path K-E (in an IGBT) that form their load paths, and each include a gate terminal G that forms a drive input. The drive of MOSFET or IGBT is performed by applying suitable gate-source voltages as drive signals.

A switching element 101, 102 of the half-bridge conducts when its drive signal S1, S2 assumes on-level, and blocks when its drive signal S1, S2 assumes an off-level. The on-level required for switching on the switching element and the off-level required for switching off, respectively, is dependent on the type of the switching elements that are used. In an n-channel MOSFET or an n-channel IGBT the on-level is a positive gate-source voltage, while for a p-channel MOSFET or a p-channel IGBT the on-level is a negative gate-source voltage. Only for illustration purposes it is assumed in connection with the further explanation that on-levels of the drive signals S1, S2 are upper signal levels or "high"-levels, respectively, of the drive signals, and that off-levels of the drive signals are lower signal levels or "low"-levels of the drive signals.

In FIG. 1 reference character 10 denotes a drive circuit that generates the drive signals S1, S2 (illustrated in dashed lines). Drive circuit may be a common drive circuit for generating drive signals for switching elements of a half-bridge. Reference character Z denotes a load (also illustrated in dashed lines) connected to the output 103 of the half-bridge, and driven by an output voltage Vout or an output current Iout of the half-bridge.

A half-bridge, as it is illustrated in FIG. 1, is, e.g., used for driving loads that require a voltage oscillating between an upper and a lower supply potential as an input voltage or supply voltage, respectively. Such loads are, e.g., inductive loads, such as lamp circuit.

Figure 3:
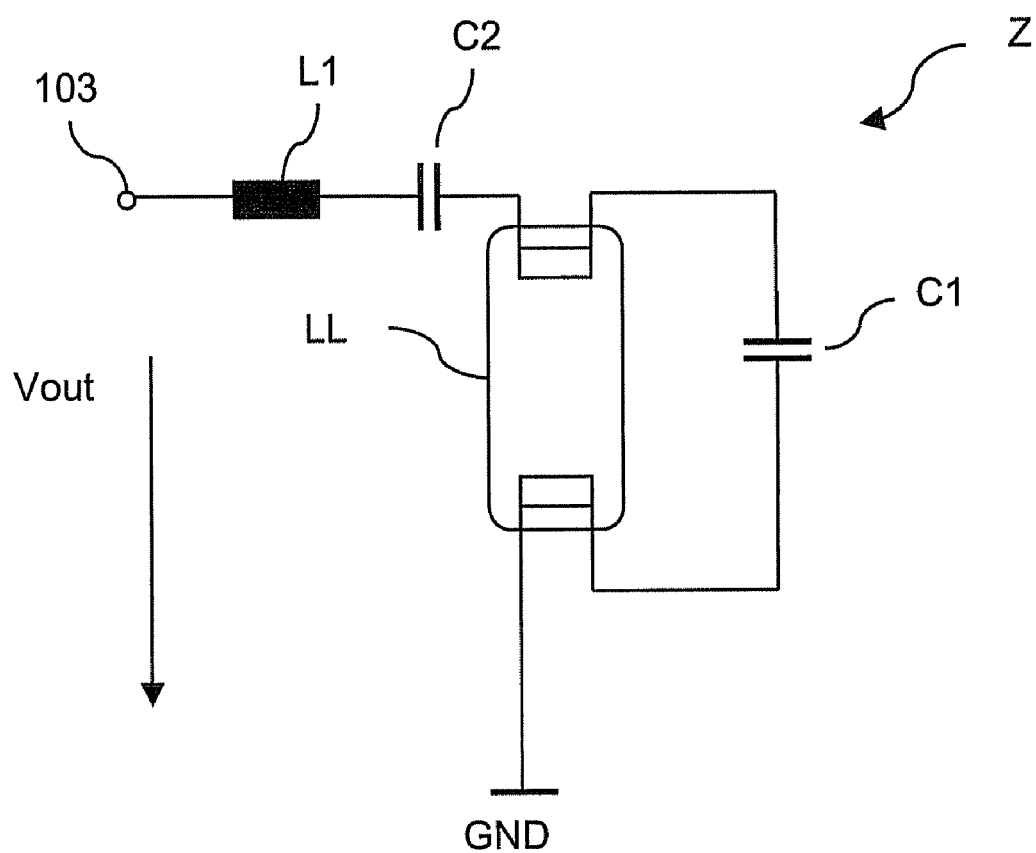
FIG. 3 illustrates an example of a load that is a lamp circuit.

Referring to FIG. 3, a load implemented as a lamp circuit includes, e.g., a series resonant circuit having a resonance capacitor C1 and a resonance inductance L1, and a fluorescent lamp LL connected in parallel with the resonance capacitor C1 and, therefore, connected in series with the resonance inductance L1. Optionally, a blocking capacitor C1 may be connected between the resonance inductance L1 and the fluorescent lamp LL, the blocking capacitor C1 serving for filtering a DC component out of the output voltage Vout.

For providing an oscillating output voltage Vout each of the switching elements 101, 102 is cyclically switched on and off in a commonly known manner, each switching element during a drive cycle assuming an on-state during an on-phase, and an off-state during an off-phase. The on- and off-phases of the two switching elements 101, 102 are phase-shifted relative to each other such that at one time only one of the switching elements 101, 102 is switched on, so that shunt currents in the half-bridge are avoided, and so that the first and the second switching element are alternatingly subject to a current flowing through. Driving the two switching elements 101, 102 by the drive circuit is performed, in one embodiment, such that between the off-phase of one of the switching elements and the off-phase of the other one of the switching elements there is a dead time during which both switching elements 101, 102 are switched off.

The circuit arrangement further includes a measuring arrangement for measuring a current flowing through the second switching element 102. This measuring arrangement is formed as a measuring resistor (shunt resistor) in the example illustrated. The resistor is connected in series with the second switching element 102 between the output 103 and the terminal for the second supply potential GND. This measuring arrangement serves for generating a current measuring signal V1. This current measuring signal in the example illustrated is a voltage V1 across the measuring resistor 21 that can be tapped at a measurement terminal 106, and that represents a current flowing through the second switching element 102.

The current measuring signal V1 is applied to a circuit arrangement 30 that is adapted to detect or diagnose, respectively, a load state, and in one embodiment an overloading, of the half-bridge 101, 102 using the current measuring signal V1. In the half-bridge circuit illustrated, a current measuring signal V1 that is unequal zero is only available during a partial period of a drive signal or drive period, respectively, namely during a partial period during which the output current Iout flows through the lower half-bridge branch, in which the measuring resistor is arranged.

Figure 4:
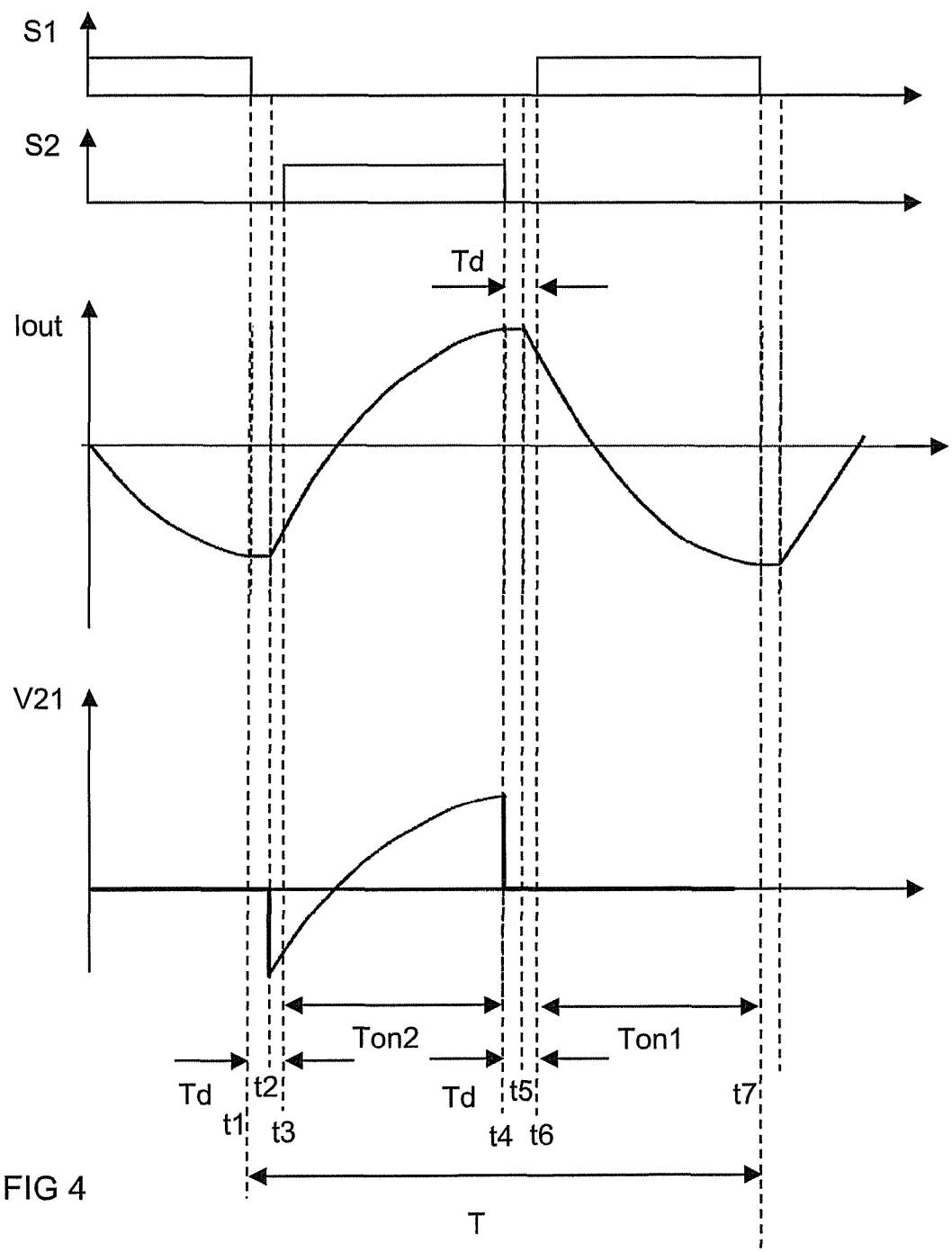
FIG. 4 illustrates exemplary timing diagrams of signals occurring in the circuit arrangement according to FIG. 1.

For a better understanding FIG. 4 illustrates timing diagrams of drive signals S1, S2 for the switching elements 101, 102 of the half-bridge, and diagrams of the output current Iout and the current measuring signal V1 resulting from driving the half-bridge with these drive signals S1, S2, for an example in which the load Z is lamp circuit as it is, for example, illustrated in FIG. 3. In this connection it should be mentioned that using the half-bridge for driving a lamp circuit is only an example, and that the half-bridge may be used for driving any inductive loads. The output current flowing with other loads may be different concerning its form from the output current Iout illustrated in FIG. 4. However, common to all inductive loads is that the output current is a periodic alternating current having a frequency that corresponds to the drive frequency of the switching elements 101, 102 of the half-bridge.

In the circuit arrangement according to FIG. 1 and the timing diagrams according to FIG. 4, the sign of the output current Iout and the voltage measuring signal V1 are selected such that the sign of the output current Iout corresponds to the sign of the current measuring signal V1 when the second switching element 102 is subject to a current flow unequal to zero.

In FIG. 4, T denotes the duration of a drive cycle or a drive period, respectively, of the half-bridge, during each drive cycle the two switches 101, 102 each being switched on once for an on-period. These on-periods of the two switches, that are denoted with ton1, ton2, may be equal, or may be different from one another.

The signal levels of the first and second drive signals S1, S2 in FIG. 4 represent the switching states of the two switching elements, an upper signal level representing an on-state and a lower signal level representing an off-state of the individual switching element 101, 102 in the example. In the embodiment illustrated, the duration of the period spans from a time t1, at which the first switching element 101 is switched off, to a time t7, at which the first switching element is again switched off at the end of the drive cycle after a previous switching on. In FIG. 4 times t3 and t4 are times at which the second switching element 102 is switched on and off t6 is the time at which the first switching element 101 after switching off the second switching element 102 is switched on.

Between switching off one switching element and switching on the other switching element there is a dead time Td during which both switching elements are switched on. In the example according to FIG. 2, these dead times, that may have equal or different durations, lie between times t1 and t3, and between times t4 and t6.

The current characteristic of the output current Iout during the dead times Td can be subdivided in two phases: a commutation phase that is between times t1 and t2 and t4 and t5, respectively, in the example, and during which the output current substantially results from discharging parasitic capacitances present in the switching elements 101, 102 or capacitances systematically added to the circuit; and a freewheeling phase, lying between times t2 and t3 and t5 and t6, respectively in the example, and during which the output current Iout flows over a freewheeling current path in that half-bridge branch that has its switching element switched on next. Referring to FIG. 1, the freewheeling current paths are, e.g., formed by freewheeling elements, such as diodes, that are connected in parallel with the switching elements 101, 102. After switching off the first switching element 101 and before switching on the second switching element 102 after the end of commutation phase t1-t2 during the freewheeling phase t2-t3 the current flows over the freewheeling element 105, and during the commutation phase t4-t5 after switching off the second switching element 202 and before switching on the first switching element 101 the current flows during the freewheeling phase t5-t6 over the freewheeling element 104 of the first switching element 101. When using a MOSFET as a switching element, freewheeling elements that are implemented as freewheeling diodes are already integrated as body diodes in the MOSFET.

A current through the measuring resistor 21 flows during the on-period Ton2 of the second switching element 102, as well as during the freewheeling phase t2-t3 before switching on the second switching element 102.

Figure 5:
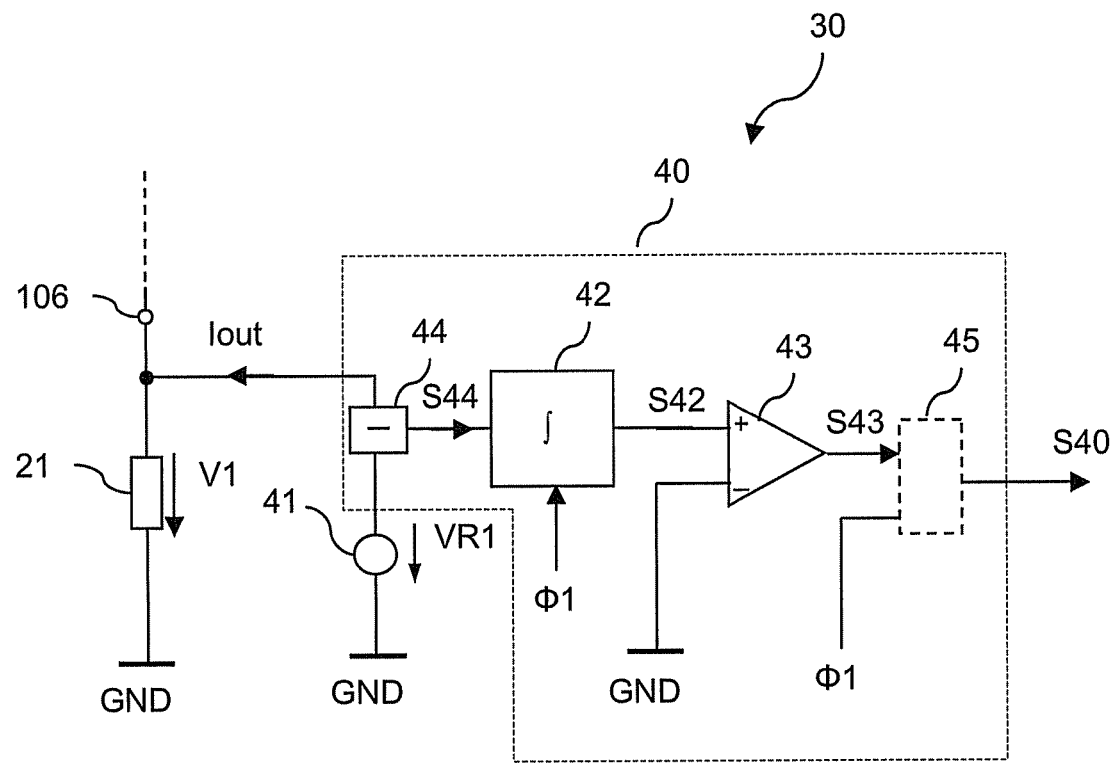
FIG. 5 illustrates one embodiment of a diagnostic circuit that includes an integration circuit.

FIG. 5 illustrates by way of a block diagram a first example of the circuit arrangement 30 that receives the voltage measuring signal V1. Circuit 30 as illustrated includes a first diagnostic circuit providing at an output a first diagnostic signal 40 that is dependent on an integral of the measuring signal V1 over a first integration period, and on an integral of a first reference signal VR1 over a second integration period. The first and the second integration periods are equal in the diagnostic circuit 40 according to FIG. 5. However, these integration periods could also be different.

The first diagnostic circuit according to FIG. 5 includes a first reference voltage source 41 providing a reference voltage VR1 as the first reference signal, as well as an integration and evaluation circuit 40 receiving the first reference signal. The integration and evaluation circuit is adapted to integrate new a difference between the current measuring signal V1 and the first reference signal VR1 for an integration period during each drive cycle, and to evaluate the integration result obtained in this way. For this, evaluation circuit 40, in the example illustrated, includes a subtractor 44 receiving the current measuring signal V1 and the first reference signal VR1, and providing a difference signal S44 as an output signal, the difference signal corresponding to a difference between the current measuring signal V1 and the first reference signal VR1 or being proportional to this difference, respectively. This difference signal V44 is supplied to an integration circuit 42 that is adapted to integrate the difference signal V44 dependent on a control signal $\Phi 1$ over the time, and to generate a integration signal S42 dependent on this time integral. The control signal $\Phi 1$ determines the time period during which the integration circuit 42 integrates the difference signal V44. Generating the control signal $\Phi 1$ will be explained hereinbelow.

The integration and evaluation circuit 40 further includes a comparator 43 receiving the integration signal S42 and being adapted to compare the integration signal S42 with a comparison value, that is zero in the example. In the example the comparison value is represented by the reference potential GND. At an output of the comparator 43 the first diagnostic signal S40 is available. Integration and evaluation circuit 40 optionally includes a storage element 45, such as a flip-flop, that stores the output signal S43 of the comparator dependent on the control signal $\Phi 1$. If a storage element 45 is present, then the first diagnostic signal S40 is available at the output of the storage element 45. The storage element 45 and the control signal $\Phi 1$ are, for example, configured such that the storage element 45 stores the output signal of the comparator S43 each time at the end of the integration period given by control signal Φ1. The first diagnostic signal S40 in this circuit keeps its value by the end of the next integration period.

As illustrated, the signal level of the diagnostic signal S40 in the first diagnostic circuit is dependent on whether the integration signal S42 at the end of the integration period is larger or smaller than the comparison value. A first operation state or load state of the half-bridge is present when the integration signal S43 at the end of the integration period is smaller than the comparison value, and a second operation state or load state of the half-bridge is present when the integration signal S43 at the end of the integration period is larger than the comparison value. In the example illustrated, the diagnostic signal S40 in the first operation state assumes a lower signal level (low level), and in the second operation state assumes an upper signal level (high level). The amplitude of the comparison value may be selected in a different manner, namely dependent on the purpose of monitoring the load state:

According to a first example, the comparison value is selected to be so (high) that a second operation state is equivalent to an overloading or an imminent overloading of the half-bridge. The diagnostic signal S40 may be applied to the drive circuit 40 of the half-bridge, this drive circuit, e.g., being adapted to switch off the half-bridge when the diagnostic signal S40 indicates the presence of the second load state, thereby protecting the half-bridge against overloading.

According to a second example, the comparison value is selected so that it represents a desired maximum power consumption of the half-bridge. The drive circuit 10, to which the diagnostic signal S40 may be applied to, is in this example, e.g., adapted to reduce or to limit the power consumption of the half-bridge by suitable driving the switches 101, 102.

Figure 6:
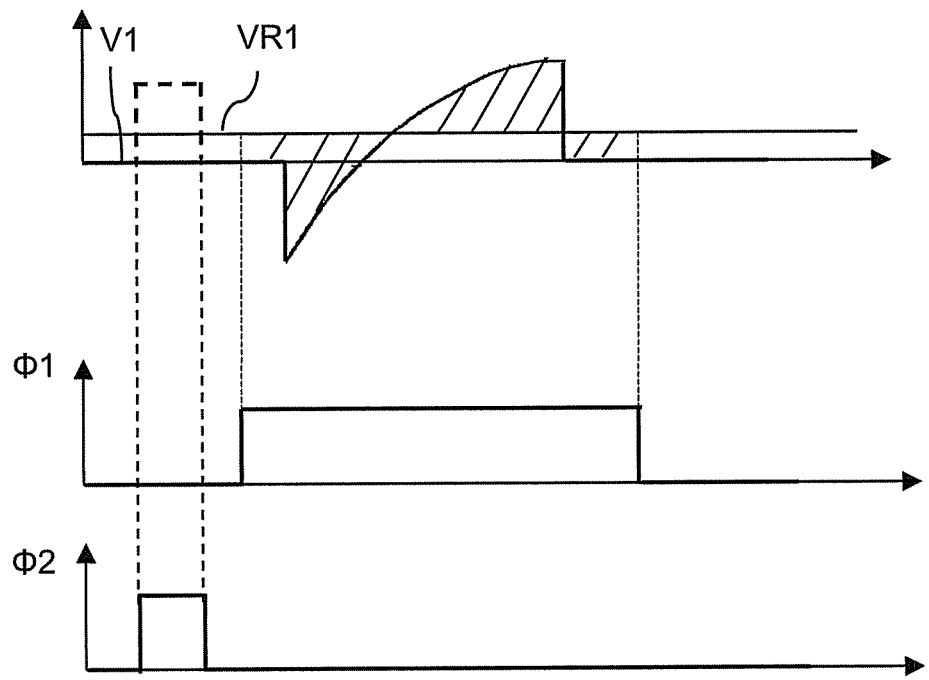
FIG. 6 illustrates the operating principle of the diagnostic circuit according to FIG. 5 by way of timing diagrams.

The operating principle of the diagnostic circuit illustrated in FIG. 5 will now be explained with reference to timing diagrams of the current measurement signals V1 as well as the reference signal VR, that are illustrated in FIG. 6. The control signal Φ1, that determines the integration time period, is also illustrated in FIG. 6. In the example illustrated the integration time period is represented by an upper signal level of control signal Φ1. For illustration purposes it may at the first be assumed that the integration time period, referring to FIG. 4, spans from time t2 to t5, i.e., from the end of the commutation time of the first switch 101 to the end of the commutation time of the second switch 102, this time period being exactly half of the time period T of a drive cycle. Further, it may be assumed that the switching elements 101, 102 do switch without delay. Assuming this, a current measuring signal V1 is zero before time t2 and after time t5.

The real power provided by the half-bridge equals—when neglecting switching losses and conduction losses of the switching element 101, 102—substantially equals the real power provided by a supply voltage source (not illustrated in FIG. 1) providing the supply voltage. For a constant supply voltage Vin the real power provided by the supply voltage source equals the product of the amplitude of the supply voltage and the mean of the current provided by the supply voltage source.

If the output current Iout does not include a DC component, for example because a coupling capacitor—as illustrated in FIG. 3 having reference character C2—present in the load path prevents the flowing of a DC component, the mean values of the currents through the switching elements 101, 102 are equal and correspond to the mean value of the current provided by the supply voltage source. For determining the mean value of the current provided by the supply voltage source it is therefore sufficient to measure the mean value of the current through one of the switching elements 101, 102 or through a current measuring resistor connected in series to one of the switching elements. In the example illustrated, for determining the mean value of the current provided by the supply voltage source—and thus for determining the provided real power—the current through the second half-bridge branch is evaluated using the measuring voltage V21 across the measuring resistor 21.

The curve over time of this current through the second half-bridge branch is—such as the curve of the current through the first half-bridge branch—unsymmetrical relative to the zero line and has a mean value unequal to zero that is a measure for the consumed real power. The "zero line" is defined by a measurement voltage V1 equal to zero. Correspondingly the curve over time of the voltage measuring signal V1 is unsymmetrical relative to the zero line. With the polarity of the output current Iout chosen in the example or the polarity of the measurement voltage V1 chosen in the example, respectively, the current proportion having a positive sign outweighs during the time period during which the lower half-bridge branch is subject to a current flowing through. The integral of the measurement voltage V1 over the overall integration period is, in this case, larger than zero and proportional to the amount of charge that has flown in total over the current measuring resistor 21 during the integration period. Under the assumption that no further consumers are connected to the supply potential Vin the energy taken from the supply voltage source during a drive cycle corresponds to the product of the amplitude of the supply voltage and the amount of charge flowing over the current measuring resistor or the integral of the measuring signal V21 over time, respectively. If the conduction and switching losses of the half-bridge are either negligible or at least known, than the energy taken from the supply voltage source in each drive cycle is a measure for the energy provided to the load in each drive cycle and is, therefore, with a known duration of the period a measure for the real power provided to the load.

Subtracting the first reference signal VR1 from the current measurement value V1, integrating the difference value S41 obtain thereby over time, and comparing the integration result S41 obtained by the integration with the comparison value corresponds to an assessment how strong the positive component of the current curve overweighs the negative component of the current curve, i.e., how large the real component of the consumed power is. In the example, the integral of the first reference signal VR1 over the integration time period serves as a comparison measure.

As explained, the signal level of the diagnostic signal S40—and therefore the detected operation state—is dependent on whether the integration signal S42 is larger or smaller than zero at the end of the integration time period. For explanation purposes the boundary case at which the integration signal S41 is equal to zero is considered first. In this case:

$$S42 = \int_{Ti} (V1 - VR1) dt \qquad (1a)$$
$$= \int_{Ti} V1 dt - \int_{Ti} VR1 dt$$
$$= \int_{Ti} V1 dt - Ti \cdot VR1$$
$$= 0$$

or, $$\int_{Ti} V1\,dt = Ti \cdot VR1 \qquad (1b)$$

respectively. Here, Ti denotes the integration period over which the difference between the measuring signal V1 and the reference signal VR1 is integrated. Since real energy can be consumed from the supply voltage source only during one half-cycle, namely during the half-cycle in which the first switching element 101 is driven to be conducting, the integral of the current during one half-cycle represents the real energy consumed during the overall drive period. Evaluating the current through the second switching element 102 for determining the real energy is permissible because—as mentioned hereinabove—the absolute values of the mean values of the currents during the two half-periods are equal.

For a supply voltage Vin kept constant the consumed real power is therefore proportional to the quotient of the integral of the measuring signal and the cycle duration. It therefore applies:

$$Pw \sim \frac{1}{T} \cdot \int_{Ti} V1\,dt, \qquad (2)$$

with Pw denoting the real power, and T denoting the cycle duration.

Reference value VR1 represents a real power threshold value, with the diagnostic signal S41 indicating the presence of the second operation mode when the integral of the measuring signal V1, representing the real energy, equals the product of the reference value VR1 and the integration period Ti.

The integration period Ti corresponds, e.g., to half of the duration T of a drive cycle. The second operation state is, referring to equation (1b) indicated in this case, when:

$$\int_{0,5T} V1\,dt = 0,5 \cdot T \cdot VR1 \qquad (3)$$

or, when referring to equation (2), respectively:

$$Pw \sim \frac{1}{T} \cdot \int_{Ti} V1\,dt = 0,5 \cdot VR1. \qquad (4)$$

In this connection it should be mentioned that the integration period is not necessarily half the duration of a drive cycle, but may also be shorter or longer. However, the integration period should have a fixed relationship relative to the duration of a drive cycle, if the duration of a drive cycle can vary. According to an example the integration period is selected such that it includes all those times in which the current flow through the current measuring resistor 21 may be different from zero. Referring to the example according to FIG. 4 the integration period in this case includes, for example, the time period from time t2 to a time that lies for a switch-off delay time of the second switching element 102 after time t4.

Figure 7:
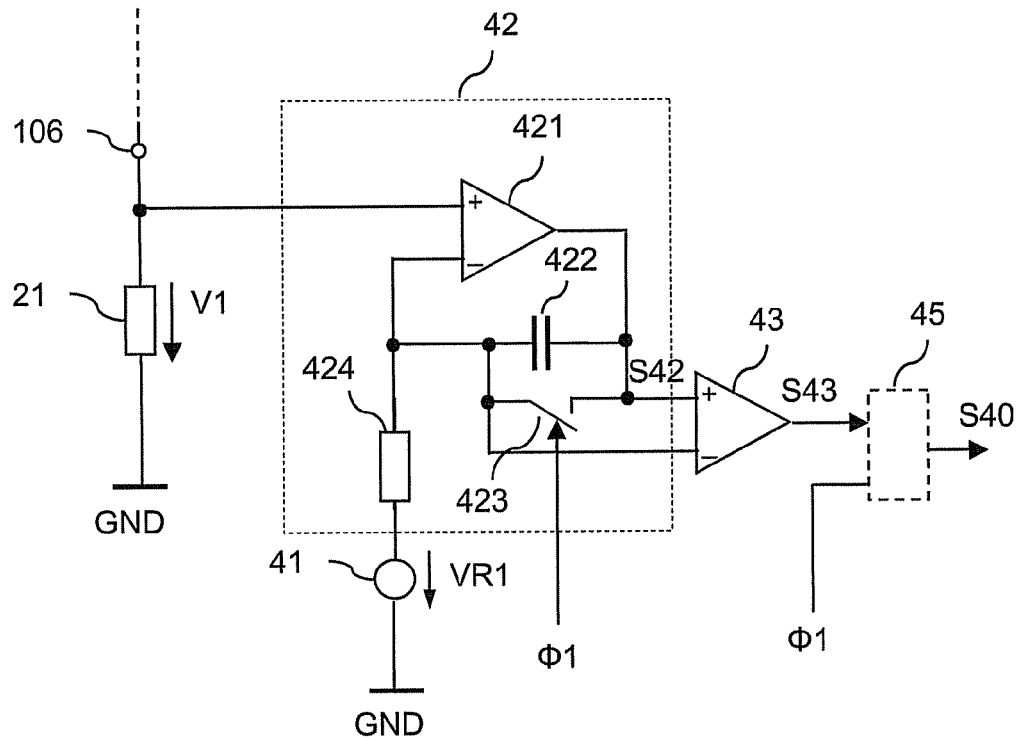
FIG. 7 illustrates one embodiment of an integration circuit.

FIG. 7 illustrates embodiment of the integration circuit 42, this embodiment simultaneously including the function of the subtractor 44. This integration circuit includes a first operation amplifier 421 having a first and a second input, as well as a capacitive storage element 422, for example a capacitor, that is connected between the second input and an output of the operation amplifier 421. In the embodiment illustrated the first input is a non-inverting input of the operational amplifier 421, and in the embodiment illustrated the second input is the inverting input of the operational amplifier. The voltage measuring signal V1 is fed to the first input of the operational amplifier 421, and the reference signal VR1 is fed to the inverting input of the operational amplifier 421 via an additional resistor 424. Forming the difference between the voltage measuring signal V1 and the reference signal VR1 is, in the example, performed by the integration circuit 42 itself, so that use of a separate subtractor can be avoided. In the integration circuit 42 illustrated, the integration signal 42 corresponds to a voltage across the capacitive storage element 422. This voltage is supplied to the comparator 43 as an input voltage.

The integration circuit 42 further includes a switch connected in parallel with the capacitive storage element 422, and being driven by control signal Φ1. During the integration time period this switch is open, the voltage across the capacitive storage element 422 at an arbitrary time between the integration time period then corresponds to the integral over time of the difference between the measurement voltage V1 and the reference voltage VR1 since the opening of switch 423. Switch 423 is closed at the end of each integration time period, so that the capacitive storage element 422 is discharged, and so that the integration circuit 42 is "discharged", and so that the integration circuit 42 is "reset" by the beginning of a next integration time period and with the beginning of the next integration time period again starts to integrate the difference signal.

Instead of integrating the difference between the measurement voltage V1 and the reference voltage VR1, and comparing the integration result that is hereby obtained with zero—as explained with reference to FIG. 6—there is, referring to FIG. 6, also the possibility to separately integrate the voltage measuring signal V1 and the reference signal VR1, and to subsequently compare the integration results that are hereby obtained with each other.

Figure 8:
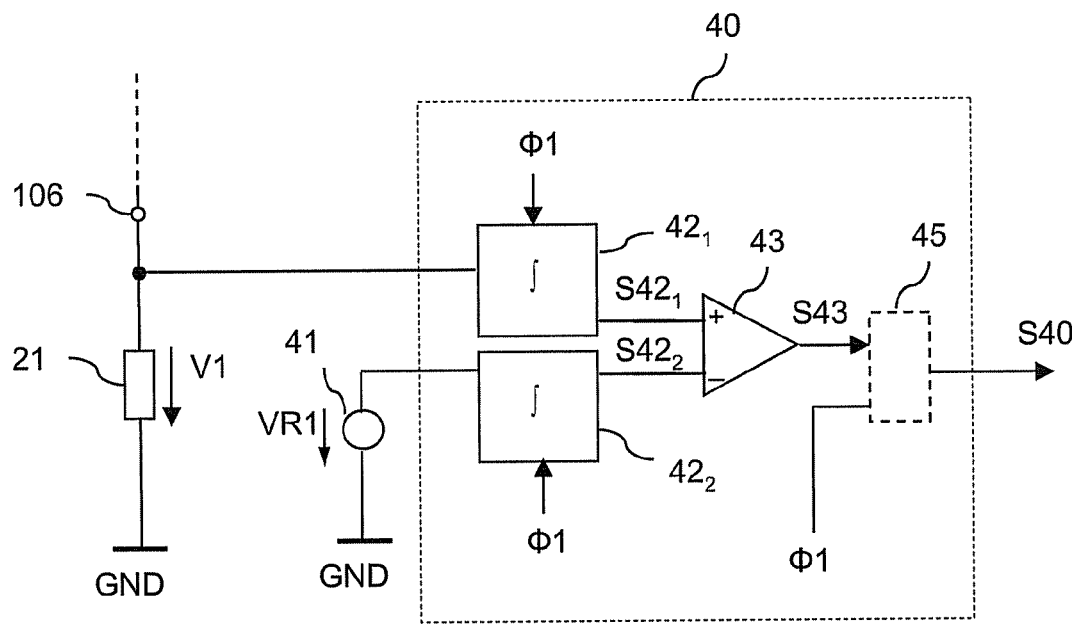
FIG. 8 illustrates one embodiment of a diagnostic circuit that includes two integration circuits.

FIG. 8 illustrates one embodiment of an integration and evaluation circuit having such a functionality. This integration and evaluation circuit includes two integration circuits: a first integration circuit $42_1$ that receives the first current measuring signal V1, and that generates a first integration signal $42_1$; and a second integration circuit $42_2$ that receives the first reference signal VR1 and that generates a second integration signal $42_2$. The first integration signal $42_1$ corresponds to the integral of the current measuring signal V1, and the second integration signal $42_2$ corresponds to the integral of the first reference signal VR1. The integration circuits $42_1$, $42_2$ are—corresponding to the integration circuit 42 explained before—configured to integrate the received input signals during an integration time period defined by control signal Φ1, and at the end of the integration time period each of the integration circuits $42_1$, $42_2$ is reset. The integration circuit $41_1$, $42_2$ are, for example, realized corresponding to the integration circuit 42 explained with reference to FIG. 7, where in the integration circuits $42_1$, $42_2$ an operational amplifier present in the integration circuits $42_1$, $42_2$ receives the corresponding input signal at its non-inverting input, while the inverting input—contrary to the integration circuit 42 according to FIG. 7—lies on reference potential GND.

In the integration and evaluation circuit illustrated in FIG. 8 comparator 43 compares the two integration signals $S42_1$, $S42_2$ and generates a comparator output signal S43 dependent on a comparison of these two signals. With equal input signals and with equal integration time periods the first diagnostic circuits 30 illustrated in FIGS. 6 and 7 on the one hand and in FIG. 8 on the other hand provide equal results, i.e., equal first diagnostic signals S40.

In one embodiment in the integration and evaluation circuit illustrated in FIG. 8 the integration time period, during which the current measuring signal V1 is integrated, and the integration time period, during which the reference signal VR1 is integrated, may be different from one another. With a change of the second integration time period compared with the first integration time period the comparison value, with which the integral of the current measuring signal V1 is compared, changes. When providing the optional storage element 45, and when providing different integration time periods the comparison signal S43 is, in one embodiment, taken over into the storage element 45 at the end of the that integration time period that ends later.

Control signal Φ1, that determines the integration time period, may, e.g., be generated from the first and second control signals S1, S2. Generating the control signal Φ1 is, for example, performed in that way that the integration time period starts a fixed delay time after the falling edge of S1 and ends the same delay time after the falling edge of S2. The delay time should be longer than the switching delay time of the switching elements 101 and 102 and shorter than the commutation time. Thus, the integration time period starts before the freewheeling phase, i.e., before t2, and ends when the current through the switching element 102 has decreased, i.e., after t4. Control signal is, in one embodiment, generated such that the integration time period during each drive cycle includes the complete time period during which the lower half-bridge branch is subject to a current flowing through, this is the time period t2-t4 in the example according to FIG. 4.

Figure 9:
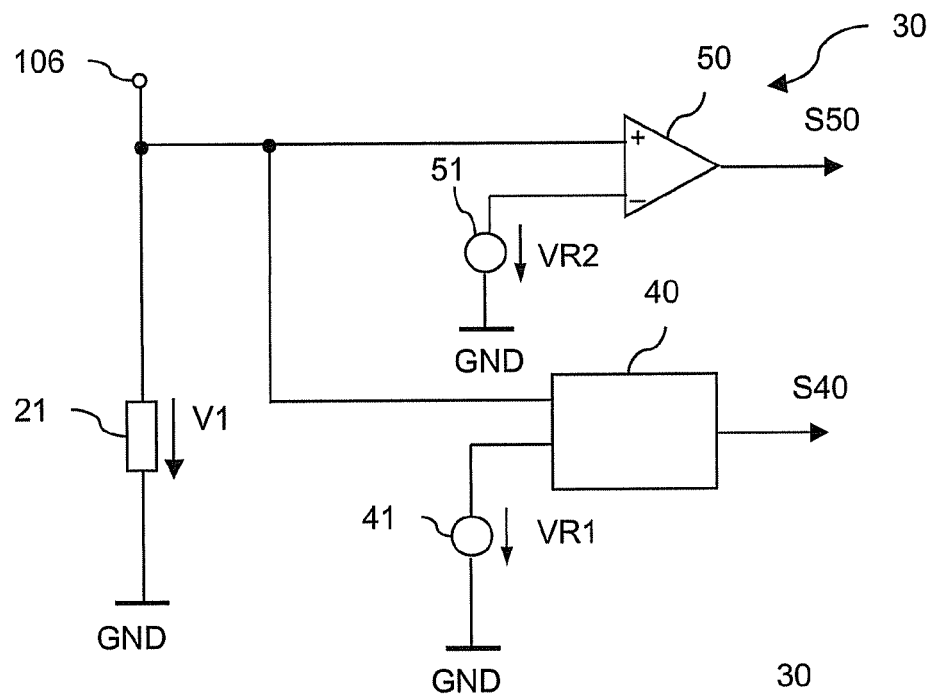
FIG. 9 illustrates one embodiment of a diagnostic circuit that provides two diagnostic signals.

FIG. 9 illustrates a further embodiment of a circuit 30 for diagnosing a half-bridge circuit. This circuit 30 additionally to the first diagnostic circuit 40, 41 includes a second diagnostic circuit 50, 51 that is adapted to evaluate the instantaneous value of the output current Iout, in order to be able to detect a over-current loading of the half-bridge. Evaluating the output current Iout is performed by evaluating the current measuring signal V1; the second diagnostic circuit 50, 51 is, therefore, connected to the measurement terminal 106 of the half-bridge, corresponding to the first diagnostic circuit 40, 41.

The second diagnostic circuit 50, 51 further includes a second comparator 50 having a first and a second input, and a second reference voltage source 51. The second input of the comparator 50, which is the non-inverting input in the example illustrated, receives the current measuring signal V1, and the second input of the second comparator, which in the embodiment is the inverting input, receives the second reference signal VR2. At the output of the second comparator a second diagnostic signal S50 is provided that indicates the occurrence of a over-current condition. This second diagnostic signal S50 dependent on the current measuring signal V1 may assume a first and a second signal level, one of which indicating an over-current condition. In the embodiment illustrated there is a over-current condition when the current measuring signal V2 rises above the second reference value V2. In this case the second diagnostic signal S50 assumes an upper signal level.

In the diagnostic circuit 30 according to FIG. 9 the reference value VR2, with which the current measuring signal V1 is compared for determining an over-current condition, is given by the second reference voltage source 51. With a given second reference voltage VR2 the threshold value of the output current Iout from which an over-current condition is detected, is dependent on the resistance value of the measuring resistor 21. This threshold value of the output current Iout, at which an over current condition is detected, may be adjusted by changing the measuring resistor 21. For this, the measuring resistor 21 may be realized as a variable resistor, so that a user of the circuit has the possibility to adjust the "over-current threshold value" by varying the resistance value of the measuring resistor 21. In another embodiment there is the possibility to replace the measuring resistor with a measuring resistor having another resistance value. In this connection it should be mentioned that the half-bridge circuit is, for example, realized as an integrated circuit to which the measuring resistor 21 may be connected to as an external resistor. Changing the resistance value of the measuring resistor 21 for adapting the over-current threshold value, however, influences the evaluation of the power consumption of the half-bridge circuit performed by the integration and the evaluation circuit 40.

Figure 10:
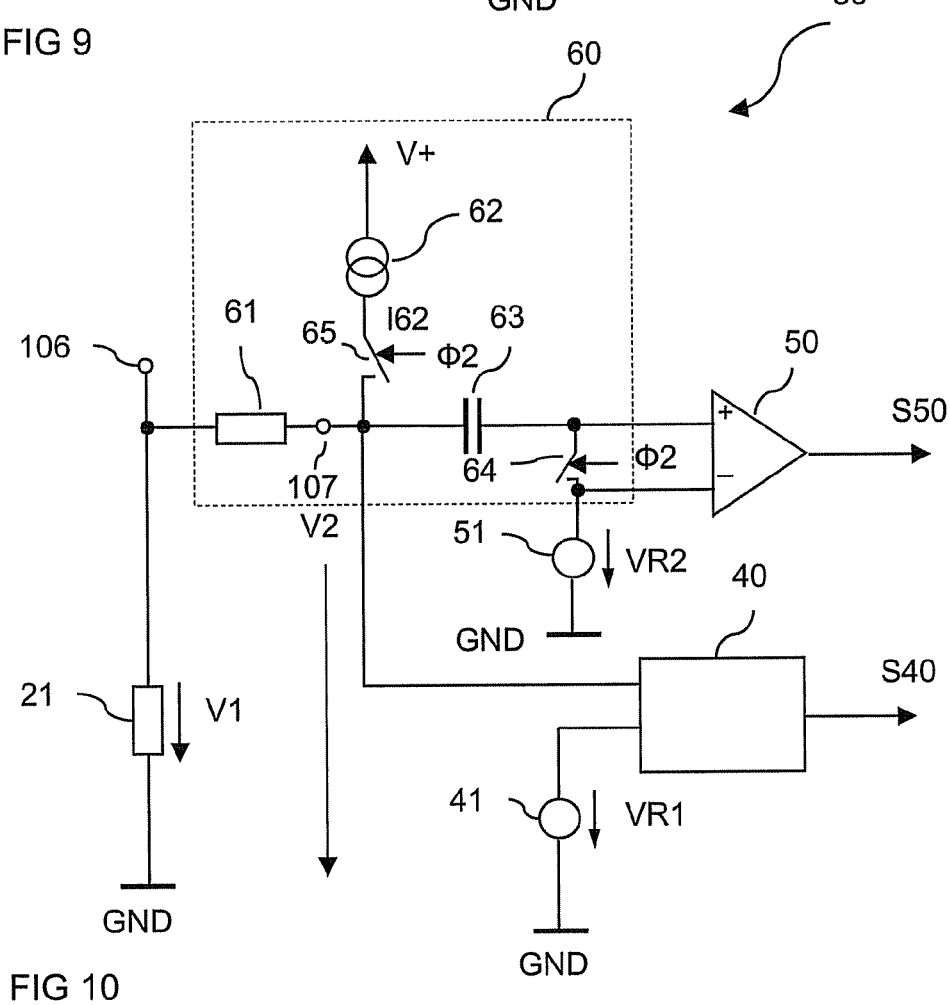
FIG. 10 illustrates a first modification of the diagnostic circuit illustrated in FIG. 9.

FIG. 10 illustrates a circuit 30 for diagnosis that is modified compared with the circuit illustrated in FIG. 9, where in this circuit 30 the reference value for evaluating the power consumption, and the reference value for determining the over-current condition can be adjusted independently from one another. For this, the circuit 30 according to FIG. 10 includes an adjustment circuit 60 that in the example illustrated serves for adjusting the reference value used for determining the over-current condition, and that is connected between the measurement terminal and the second diagnostic circuit. The adjustment circuit 60 includes a further resistor 61 connected in series with a current source 62 and a switch 65 between a terminal for a positive potential V+ relative to reference potential GND and the measurement terminal 106. The adjustment circuit further includes a capacitive storage element 63, e.g., a capacitor, connected between that terminal of the second resistor 61 facing away from the measurement terminal, and the first terminal of the second comparator 50. The adjustment circuit 60 further includes a further switch 64 connected between the two terminals of the second comparator 50.

The two switches 64, 65 of the adjustment circuit 60 are driven by a drive circuit (not illustrated in detail) in such a manner that the two switches 64, 65 during a phase in which no load current flows through the lower half-bridge branch, i.e., during which the current measuring signal V1 is zero, are closed for given time period. A drive signal of these two switches 64, 65 is denoted as Φ2 in FIG. 10. An example of the timing diagram of this drive signal Φ2 is also illustrated in FIG. 6. In this example an upper signal level of this drive signal represents a switching state in which the two switches 64, 65 are closed. The on-period of these two switches lies before the beginning of the integration time period and within a time phase during which no load current flows through the lower half-bridge branch.

With closed switch 65 a current I62 provided by the current source 62 flows via the second resistor 61 and the measuring resistor 21 to reference potential GND, so that a voltage drop across the measuring resistor V1 results. This voltage drop results in a measurement voltage V1 unequal to zero during the on-period of the two switches 64, 65, which is illustrated in dashed lines in FIG. 7. The diagnostic signal generated by the integration and evaluation circuit 42 is not influenced through this, because the time period during which the two switches 64, 65 are closed lie outside the integration time period.

With closed switches 64, 65 capacitor 63 of the adjustment circuit 60 is charged to a voltage V63, for which applies $$V63 = VR2 - (R21 + R61) \cdot I62 \qquad (5)$$

Here, VR2 denotes the second reference voltage, R21 and R61 denote the resistance values of the measuring resistor 61 and the second resistor 61, and I62 denotes the current provided by current source 62.

After opening switches 64, 65, capacitor 63 is kept charged at this voltage V63. Thus, capacitor 63 in connection with switches 64 and 65 acts like a sample-and-hold-element. The input current of the second comparator 50, and the input current of the integration evaluation circuit 40 are negligible so that the second resistor 61 during the time periods in which both switches 64, 65 are opened, i.e., in one embodiment during the integration time period, are not subject to a current flowing through, so that the voltage drop across this resistor 61 is zero during the integration time period. The integration and evaluation circuit 40 receives voltage measuring signal V1 during the integration time period, i.e., the operating principle of the integration and evaluation circuit 40 does not change in the presence of the adjustment circuit 60.

After opening the two switches 64, 65 the input voltage V50 of the second comparator is:

$$V50=V1+V63-VR2=V1-(R21+R61)\cdot I62 \qquad (6)$$

In this case an over-current condition is detected when the measurement voltage V1 is larger than a comparison voltage $VR3=(R21+R61)\cdot I62$. This comparison voltage VR3 corresponds to the voltage drop across the measuring resistor 21 and the second resistor 61 with closed switches 64, 65. This reference voltage VR3 is adjustable through the second resistor 61 in one embodiment. For this, the second resistor 61 may, for example, be realized as a variable resistor. Further, there is the possibility to realize the circuit components of the diagnostic circuit 30, except for the second resistor 61, as an integrated circuit, and to connect the second resistor 61 as an external, and therefore exchangeable resistor to the integrated circuit. A terminal of this integrated circuit for connecting the external resistor 61 has reference character 107 in FIG. 10.

Having the opportunity of selecting the measuring resistor 21 and the second resistor independently from one another, it is possible in the diagnostic circuit illustrated in FIG. 10 to adjust the reference value VR3 for determining the over-current condition, and the reference value for determining the power consumption independently from one another. In the circuit according to FIG. 10 the reference value for determining the power consumption is given by the reference voltage source 41. However, at a given output current Iout the current measuring signal V1 is adjustable by varying the measuring resistor 21.

Figure 11:
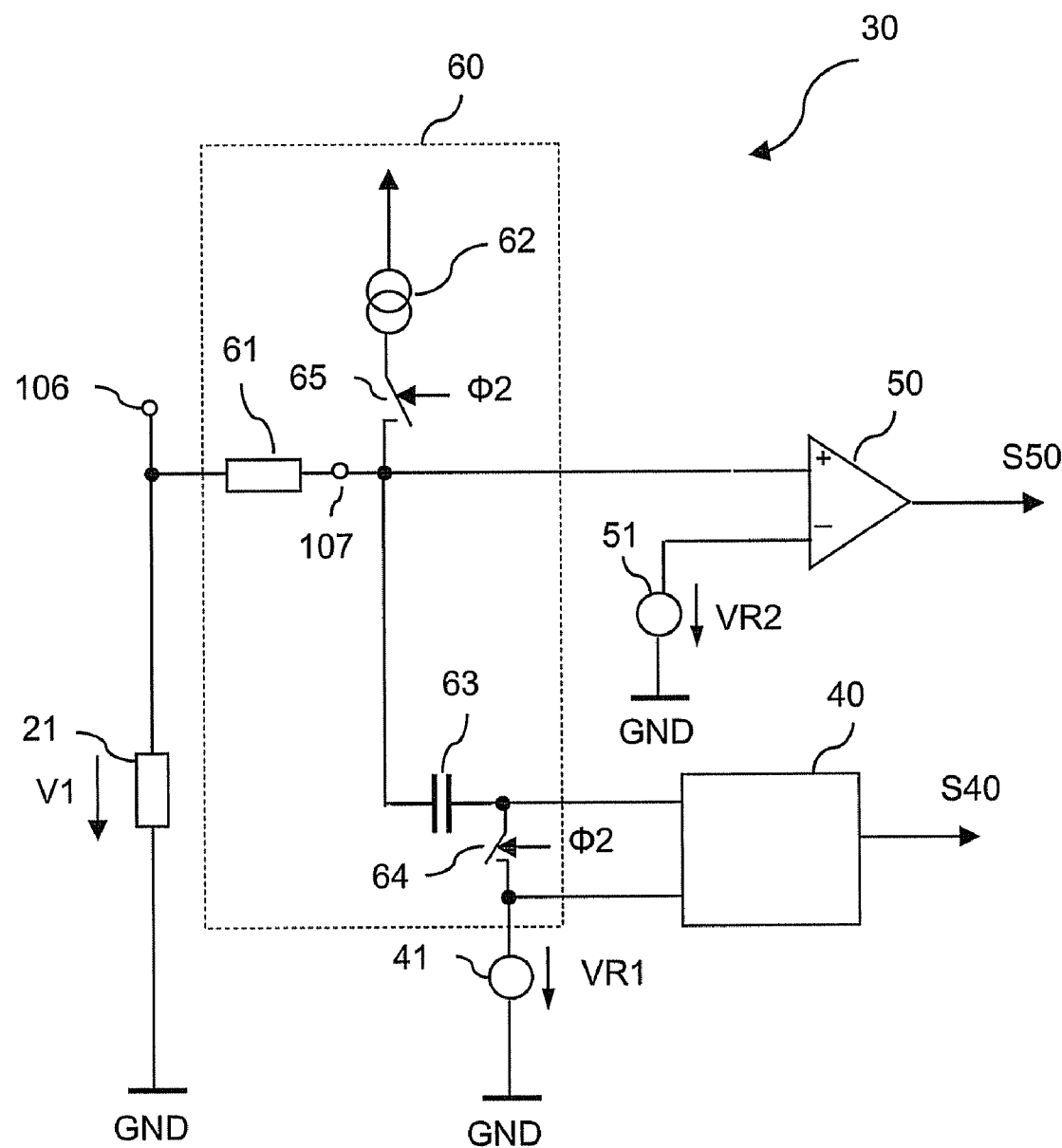
FIG. 11 illustrates a second modification of the diagnostic circuit illustrated in FIG. 9.

FIG. 11 illustrates a circuit that is modified compared with the circuit in FIG. 10. The circuit according to FIG. 11 is different from the one illustrated in FIG. 10 in that the adjustment circuit 60 is connected between the measurement terminal 106 and the first diagnostic circuit in the circuit according to FIG. 11. In the adjustment circuit 60 according to FIG. 11 the capacitor 63 is charged to a voltage V63 during the time period during which the two switches 64, 65 are closed, for this voltage V63:

$$V63=VR1-(R21+R61)\cdot I62 \qquad (7).$$

The integration and evaluation circuit 40 may be realized corresponding to the integration and the evaluation circuits explained hereinabove. In the diagnostic circuit illustrated in FIG. 10 an input voltage V40 of the integration and evaluation circuit is:

$$V40=V1+V63-V21=V1-(R21+R61)\cdot I62 \qquad (8)$$

A reference value VR4, that serves for evaluating the current measuring signal V1 is in this case: $VR4=(R21+R61)\cdot I62$.

The diagnostic signals generated by diagnostic circuit 30 may be further processed in different manners. According to one embodiment the half-bridge circuit is permanently switched off when the second diagnostic signal indicates an over-current condition. In another embodiment there is the possibility to permanently switch off the half-bridge only when the second diagnostic signal S50 indicates an over-current condition for a given number of consecutive drive cycles of.

The first diagnostic signal S40, indicating whether a power consumption of the half-bridge is above or below a given threshold value, may, for example, be used for readjusting the power consumption of the half-bridge circuit. The power consumption of the half-bridge circuit is, for example, dependent on the drive frequency of the half-bridge, i.e., dependent on the duration of the individual drive cycles. According to one embodiment the drive frequency of the half-bridge is controlled dependent on the first diagnostic signal, namely in such a manner, e.g., that the drive frequency is changed as long as the power consumption is below the given threshold value whenever the first diagnostic signal indicates that the power consumption is above a threshold value.

According to a further embodiment the integration time period is selected such that it is significantly shorter than the duration of a half-cycle or significantly shorter than the on-period of the second switching element 102, respectively. The integration period starts, e.g., with switching on the second switching element 102, i.e., time t3 referring to FIG. 4, the integration period only being between 1% and 5% of the switch-on period (t3-t4 in FIG. 4), e.g. With an on-period of the second switching element of about 10 µm, corresponding to a switching frequency of about 50 kHz, the integration period is, e.g., about 200 ns. By integrating the half-bridge current during such a short time after switching on the second switching element 102 a "non-zero-voltage switching operation" of the half-bridge may be determined. Such "non-zero-voltage switching operation" is a mode of operation in which the switching elements 101, 102 are switched on at times at which the voltage at the output of the half-bridge has not yet decreased to zero. During such "non-zero-voltage switching operation" increased losses in the half-bridge may occur. If there is a non-zero-voltage switching operation immediately after switching on the second switching element 102 a current pulse occurs that decreases rapidly and that has a positive sign when using the sign convention of FIG. 4. The duration of such current pulse is in the range of several hundred ns, and is therefore within the integration time period. In this case the reference signal VR1 is selected such that the integral of the current measuring signal V1 has an absolute value that is larger than the integral of the reference signal only when such a current pulse is present, i.e., when there is a non-zero-voltage operation.

By using the amplitude of the reference signal VR1 it can be determined at which area of the current pulse a non-zero-voltage operation is detected. The integral of the current pulse is the higher, the larger the voltage applied to the switching element before the switch-on time. By way of a suitable choice of the reference signal VR1 it can be determined that a non-zero-voltage operation, during which before the switch-on time only a relatively low voltage is present at the switching element, that results in only low switch-on losses, is detected as a faultless operation, because in this case the integral of the current measuring signal is smaller than the integral of the reference signal.

By comparing the integral of the current measuring signal with several integrals of different reference signals non-zero-voltage operations of different degrees may be differentiated from one another. It may, for example, thus be differentiated between a non-zero-voltage operation in which the voltage at the switching element before switching on is unequal zero, and a hard commutation, at which the load current during the dead time flows through the freewheeling diode of the other half-bridge circuit and results in significant commutation losses at switch-on time. The non-zero-voltage operation only results in an increased power loss, and is therefore harmless for a limited time period of, e.g., several seconds, while the hard commutation may result in a thermal distraction of the half-bridge within a few switching cycles, and has to be stopped by switching off the half-bridge after a relatively short delay.

The method explained before and the circuit arrangement explained before use the feature of the measuring signal V1 tapped off at the measuring resistor 21 that it is at least during the switch-on periods of the upper half-bridge circuit 101 virtually zero, and does not need to be evaluated during this switch-on periods. Contrary to a real mean value calculation, the integration of the measuring signal over partial sections of a drive period that is performed in the method explained before is indeed and inexpensively possible using analog integrated circuits, if the integrator is reset once in each period. Resetting the integrator during the time periods during which the measuring signal is zero, i.e., during the switch-on periods of the upper half-bridge switch 101, is performed without a loss of information.

The integral over the current measuring signal V1 not necessarily allows a reliable conclusion on its mean value, because as additional influence factors cycle durations, the integration period, and the inevitable manufacturing fluctuations of the resistors and capacitors used for forming the integrals in analog integrated circuits additionally are to be taken into account.

In this connection the method uses the fact that not the amplitude of the mean value is of interest, but only the information whether the mean value is larger or smaller than a threshold value, or roughly equal to the threshold value. For this, according to an alternative subtracting the current signal from the threshold value is shifted before forming the integral. Because only the integral is formed over a determined partial section of the period, the threshold value may before be amplified by a factor that, e.g., equals the quotient of the cycle duration and the integration period. In one embodiment to this a rectangular pulse may be subtracted from the current signal, the pulse period of which completely lying within the integration period and having a fixed known relationship to the cycle duration. The required amplifying factor for the threshold value is, therefore, equal to the ratio of the cycle duration and the pulse period.

If the value of the current signal V1 equals the threshold value, then the resulting integral is zero and is, therefore, independent of the cycle duration and manufacturing fluctuations. It can be assumed that reference voltage sources, such as band gap circuits, amplifying factors and ratios of time periods may be realized significantly more precise and more inexpensive in analog integrated circuits than resistance values and capacitance values. Therefore, prior to resetting the integrator its state has only to be compared with zero (or the reset value, if not zero, respectively) for obtaining an information whether the mean value is larger, smaller, or about equal to the threshold value.

According to an example the measuring signal V1 is integrated for integration periods of different lengths during different drive cycles. In doing so integration period and comparison value may be adjusted during one drive cycle, for example, that reaching the second operation state, or exceeding of a maximum power consumption, respectively, may be detected. During another drive cycle the integration period and the comparison value may, for example, be adjusted such that a non-zero-voltage operation may be detected. During that another drive cycle the integration period and the comparison value may, for example, be adjusted such that a hard commutation may be detected. These different integration periods and comparison values may, for example, be adjusted in time multiplex. It goes without saying that all integration periods and comparison values may also be used during each drive cycle. In this case, the evaluation circuit explained before is to be duplicated correspondingly.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. A method comprising:
providing a half-bridge that has a first and a second switching element connected in series with each other;
driving the first and the second switching element on and off cyclically, with the switching elements during one drive cycle being alternatingly driven on and off such that they are alternatingly subject to a load current flowing therethrough;
providing a current measuring signal representing a current flow through one of the switching elements;
providing a first reference signal;
generating a first diagnostic signal that is dependent on an integral of the measuring signal over a first integration period, and on an integral of a first reference signal over a second integration period.

2. The method of claim 1, wherein the first integration period equals the second integration period.

3. The method of claim 1, wherein the diagnostic signal is dependent on the integral of a difference between the current measuring signal and the reference signal over the first integration period.

4. The method of claim 2, wherein the first integration period at least includes a time period during which the one of the switching elements is subject to a current flow that is unequal to zero.

5. The method of claim 4, wherein the first integration period at least approximately equals half a duration of a drive cycle.

6. The method of claim 2, wherein the first integration period has a fixed relationship to the cycle duration of a drive cycle.

7. A method comprising:
providing a half-bridge that has a first and a second switching element connected in series with each other;
driving the first and the second switching element on and off cyclically, with the switching elements during one drive cycle being alternatingly driven on and off such that they are alternatingly subject to a load current flowing therethrough;
providing a current measuring signal representing a current flow through one of the switching elements;
providing a first reference signal;
generating a first diagnostic signal that is dependent on an integral of the measuring signal over a first integration period, and on an integral of a first reference signal over a second integration period; and generating a second diagnostic signal dependent on a comparison of the current measuring signal with a second reference value.

8. The method of claim 7, wherein the current measuring signal is a voltage across a current measuring resistor connected in series to the second switching element.

9. The method of claim 8, wherein one of the first and second reference signals is provided by a first reference signal source; and wherein providing the other one of the first and second reference signals comprises:

driving a reference current through the current measuring resistor and through a second resistor connected in series to the current measuring resistor during a time period during which a load current through the second switching element is zero; and generating the other one of the first and second reference signals dependent on a voltage drop caused by a reference current across the current measuring resistor and the second resistor.

10. The method of claim 9, further comprising:

providing a second reference voltage source that provides a reference voltage, and generating the other one of the first and second reference signals dependent on a voltage drop caused by the reference current across the current measuring resistor and the second resistor, and a voltage generated by the second reference voltage source.

11. A circuit arrangement for diagnosing a half-bridge having a first and a second switching element that are connected in series and that are cyclically driven on an off, and that during a drive cycle can be driven on and off alternatingly such that they are alternatingly subject to a current flowing through, the circuit arrangement comprising:

an input for applying a current measuring signal representing a current flow through one of the switching elements;

a reference voltage source for providing a first reference signal; and a first diagnostic circuit being configured to generate a first diagnostic signal dependent on an integral of the measuring signal over a first integration period, and on an integral of the first reference signal over a second integration period.

12. The circuit arrangement of claim 11, wherein the first integration period equals the second integration period.

13. The circuit arrangement of claim 11, wherein the first diagnostic circuit is adapted to generate the first diagnostic signal such that it is dependent on the integral of the difference between the current measuring signal and the reference signal over the first integration period.

14. The circuit arrangement of claim 13, wherein the first integration period at least includes the time period during which the second switching element is subject to a current flow that is unequal to zero.

15. The circuit arrangement of claim 14, wherein the first integration period at least approximately equals half a duration of the drive cycle.

16. The circuit arrangement of claim 13, wherein the first integration period has a fixed relationship to the cycle duration of the drive cycle.

17. The circuit arrangement of claim 11, further comprising: a second diagnostic circuit that is adapted to generate a second diagnostic signal that is dependent on a comparison of the current measuring signal with a second reference value.

18. The circuit arrangement of claim 17, comprising:

a first reference signal source for providing one of the first and second reference signals;

an adjustment circuit for generating the other one of the first and second reference signals, comprising:

a reference current source connectable to the input;

a sample-and-hold circuit connected to the input, and a capacitive storage element connected between the input and one of the diagnostic circuits.

19. The circuit arrangement of claim 18, wherein the adjustment circuit further comprises:

a resistor connected between the reference current source and the input.

20. A method for diagnosing a half-bridge that comprises a first and a second switching element connected in series with each other and being cyclically driven on an off, the switching elements during a drive cycle being alternatingly switched on and off such that they are alternatingly subject to a load current flowing through, the method comprising:

providing a first current measuring signal using a measuring resistor connected in series with the second switching element;

evaluating the current measuring signal using a first and a second reference signal, the first reference signal being generated by a first reference voltage source, and generating the second reference signal comprises:

driving a reference current through the measuring resistor and a second resistor during a time period during which a load current through the second switching element is zero; and generating the second reference signal dependent on a voltage drop caused by the reference current and the measuring resistor and the second resistor.

* * * * *

UNITED STATES PATENT AND TRADEMARK OFFICE
CERTIFICATE OF CORRECTION

| | | |
|---|---|---|
| PATENT NO. | : 7,982,452 B2 | |
| APPLICATION NO. | : 12/512058 | |
| DATED | : July 19, 2011 | |
| INVENTOR(S) | : Martin Feldtkeller | |

It is certified that error appears in the above-identified patent and that said Letters Patent is hereby corrected as shown below:

Column 10, line 32, delete "an" and insert in place thereof --and--.

Signed and Sealed this
Eighth Day of November, 2011

David J. Kappos
*Director of the United States Patent and Trademark Office*